(12) United States Patent
Kotter et al.

(10) Patent No.: US 7,796,028 B1
(45) Date of Patent: Sep. 14, 2010

(54) CIRCUITRY, SYSTEMS AND METHODS FOR DETECTING MAGNETIC FIELDS

(75) Inventors: Dale K. Kotter, Shelley, ID (US); David F. Spencer, Idaho Falls, ID (US); Lyle G. Roybal, Idaho Falls, ID (US); David T. Rohrbaugh, Idaho Falls, ID (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 426 days.

(21) Appl. No.: 11/461,515

(22) Filed: Aug. 1, 2006

(51) Int. Cl.
*G08B 1/08* (2006.01)

(52) U.S. Cl. .............................. 340/539.22; 340/568.1; 340/547; 340/655

(58) Field of Classification Search ......... 340/551–563, 340/572.1–572.9, 567, 568.1, 571, 640, 655, 340/664, 547, 545.3–545.4, 510, 539.22
See application file for complete search history.

(56) References Cited

U.S. PATENT DOCUMENTS

| | | | |
|---|---|---|---|
| 4,719,426 A | | 1/1988 | Weiss |
| 5,786,690 A | * | 7/1998 | Kirtley et al. ............... 324/248 |
| 5,842,986 A | * | 12/1998 | Avrin et al. .................. 600/407 |
| 6,104,285 A | * | 8/2000 | Stobbe ......................... 340/505 |
| 6,150,810 A | * | 11/2000 | Roybal ......................... 324/244 |
| 6,208,884 B1 | | 3/2001 | Kumar et al. |
| 6,496,713 B2 | * | 12/2002 | Avrin et al. .................. 600/409 |
| 7,106,056 B2 | * | 9/2006 | Czipott et al. ................ 324/244 |
| 7,248,204 B2 | * | 7/2007 | Lovberg et al. ............... 342/22 |
| 7,319,321 B2 | * | 1/2008 | Murray et al. ............... 324/244 |
| 7,329,389 B2 | * | 2/2008 | Horovitz et al. ............... 422/83 |
| 2004/0000999 A1 | * | 1/2004 | Turner et al. ............. 340/572.4 |
| 2004/0018644 A1 | | 1/2004 | Johnson et al. |
| 2004/0080315 A1 | * | 4/2004 | Beevor et al. ................ 324/244 |
| 2004/0189293 A1 | * | 9/2004 | Czipott et al. ................ 324/244 |
| 2005/0134262 A1 | | 6/2005 | Clarke et al. |
| 2005/0149002 A1 | | 7/2005 | Wang et al. |
| 2005/0182590 A1 | | 8/2005 | Kotter et al. |
| 2008/0136631 A1 | * | 6/2008 | Fluck .......................... 340/551 |

\* cited by examiner

*Primary Examiner*—Daniel Previl
(74) *Attorney, Agent, or Firm*—TraskBritt

(57) ABSTRACT

Circuitry for detecting magnetic fields includes a first magnetoresistive sensor and a second magnetoresistive sensor configured to form a gradiometer. The circuitry includes a digital signal processor and a first feedback loop coupled between the first magnetoresistive sensor and the digital signal processor. A second feedback loop which is discrete from the first feedback loop is coupled between the second magnetoresistive sensor and the digital signal processor.

22 Claims, 10 Drawing Sheets

CIRCUITRY, SYSTEMS AND METHODS FOR DETECTING MAGNETIC FIELDS

GOVERNMENT RIGHTS

This invention was made under a Cooperative Research and Development Agreement between The Walt Disney Company and Battelle Energy Alliance, LLC, under Contract DE-AC07-05-ID14517 awarded by the U.S. Department of Energy. The Government has certain rights in the invention.

TECHNICAL FIELD

This invention relates to circuitry, systems and methods for detecting magnetic fields, and more particularly, to improving the sensitivity and spatial resolution capabilities of security screening systems for detecting magnetic fields.

BACKGROUND OF THE INVENTION

Detecting threatening objects or items such as weapons in public venues has increased in importance as society becomes more violent and the public becomes more concerned with safety. In response to these safety concerns, security screening methods and systems have become more prevalent and are being used in facilities and places where the need for screening was previously not considered necessary. To increase safety while keeping public inconvenience at a minimum, the focus of the security screening industry is to increase the accuracy of distinguishing between threatening and non-threatening objects while maintaining a high throughput.

However, conventional security screening systems (also referred to as "conventional systems") lack an adequate support structure and capability to combine increased sensitivity with increased selectivity and provide a reasonable throughput. For example, as the sensitivity of conventional systems is increased to facilitate detecting more objects that may be used in a threatening matter, more non-threatening objects are being detected and indicated as threatening objects. Increasing the detection of non-threatening objects adds no benefit to safety and detrimentally decreases throughput, which is very problematic if the conventional system is located in an airport. The conventional systems are detecting watches, belts, pocket change, buckles and keys as being potential weapons, and in response providing "false alarms," due to a lack of selectivity or distinguishing capabilities of the conventional systems. Accordingly, increased sensitivity without increased selectivity is not beneficial to safety or throughput.

These false alarms, which are due to mischaracterizing non-threatening objects, have a dramatic effect on the throughput of a conventional system as evidenced by the long lines of people awaiting the screening process at airports. The indication of a potential weapon or threat on a person means the screening process has to be temporarily interrupted to remove the person from the screening process for further investigation. Accordingly, if the potential problem or threat is a false alarm, the throughput of the system is unnecessarily interrupted and diminished without providing any benefit in the context of safety to the public. In fact, these false alarms can cause chaos at the busier airports. However, if conventional systems had adequate capability to selectively characterize the above list of items as non-threatening, then public safety and throughput of the screening process is maintained.

Additionally, conventional systems are sensitive to background noise and interference which greatly affects the throughput of the conventional system. For example, due to background noise and interference, conventional systems can indicate a threatening object on a person when no object exists which results in another false alarm. That is, this false alarm is not the result of mischaracterizing an existing object, but the result of an indication that an object exists when it does not. Sources of background noise include wheelchairs, trams, subways and even automobiles that pass proximate, but outside, a screening region of the conventional system. Once an alarm is indicated, whether false or not, only a more thorough investigation can determine if a threatening object exists. In the meantime, the throughput of the system has been interrupted and diminished. More problematic, background noise can interfere with the operability of conventional systems by overwhelming the system to mask the detection of a legitimately threatening object. Furthermore, if the magnitude of the background noise or interference is substantial, the operation of the system can be temporarily suspended or rendered inoperable.

Another form of interference or background noise that needs to be addressed in conventional systems is crosstalk between two or more systems, or crosstalk between respective portals of a single conventional system. Crosstalk results from the close proximity of circuitry and electronic components wherein undesirable communication occurs between the conventional systems or portals and effectively negates or impedes a proper screening process. Conventional structures and methods to address crosstalk include providing physical buffer zones to impede or block the interference. However, the buffer structures increase the area or footprint of a conventional system. In facilities where surface area is at a premium, increasing the footprint of a conventional system may not be an option if any desirably throughput is to be maintained.

Accordingly, there is a need to improve the capabilities of circuitry, systems and methods for detecting magnetic fields. There is a need to improve the capabilities of conventional security screening systems wherein increasing the sensitivity of the system does not affect the selectivity or distinguishing capability of the system thereby maintaining a reasonable throughput. Moreover, there is a need to increase the selectivity or distinguishing capability of the conventional security screening systems. Furthermore, there is a need to improve designs of security screening systems to negate or cancel background noise and interference without increasing the footprint of the system. Making these improvements will increase the capability of security screening systems to detect threatening objects, to distinguish between threatening and non-threatening objects, and to increase throughput, all the while increasing public safety.

SUMMARY OF THE INVENTION

Some aspects of the invention provide circuitry for detecting magnetic fields. The circuitry includes a first magnetoresistive sensor and a second magnetoresistive sensor configured to form a gradiometer. The circuitry includes a digital signal processor and a first feedback loop coupled between the first magnetoresistive sensor and the digital signal processor. A second feedback loop, which is discrete from the first feedback loop, is coupled between the second magnetoresistive sensor and the digital signal processor.

BRIEF DESCRIPTION OF THE DRAWINGS

The drawings illustrate what is currently considered to be the best mode for carrying out the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
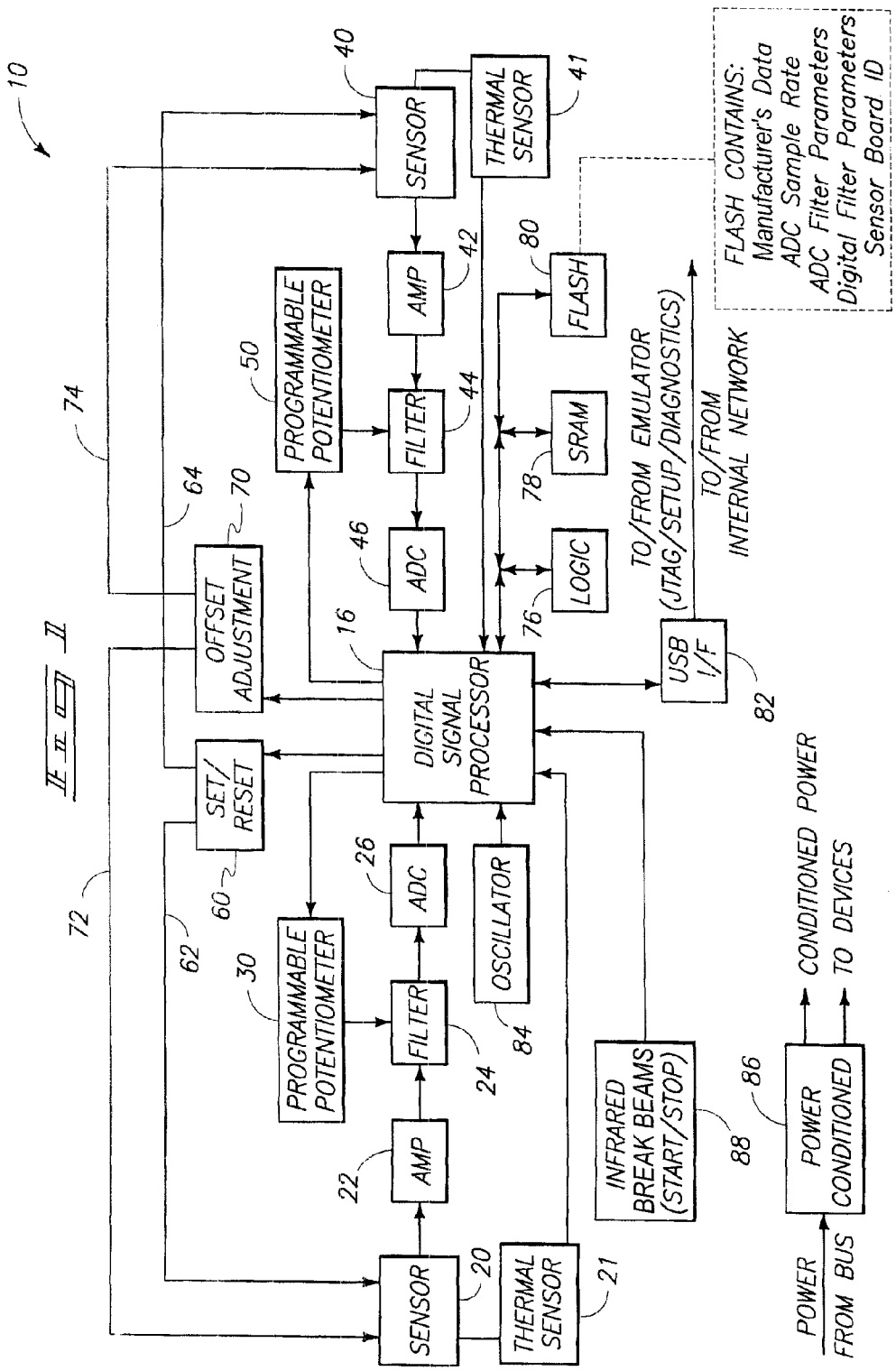
FIG. 1 is a schematic diagram of an exemplary magnetic sensor board according to various embodiments of the present invention. The exemplary magnetic sensor board can be included in circuitry for a gradiometer.

FIG. 1 is a schematic diagram of an exemplary magnetic sensor board, including gradiometer circuitry 10, according to an embodiment of the present invention. An exemplary magnetic sensor is a magnetometer which is a device having a single sensor that senses or detects disturbances or changes in uniform magnetic fields, for example, the magnetic field of the earth. In general, weapons and/or threatening objects can be classified as ferrous or ferromagnetic objects. When a ferrous object passes within a sensing or scanning region of the magnetometer, the magnetic field of the ferrous objects disturbs or changes the uniform magnetic field of the earth. The magnetometer measures this change as a gradient in the magnetic field and outputs a signal which is representative of characteristics of this gradient of the magnetic field. The output signal, for example, an analog signal such as a voltage, indicates the presence of a ferrous object within the scanning region, and therefore, indicates the presence of a potential weapon.

However, to function most effectively, the magnetometer has to remain substantially stationary because the scanning region of the magnetometer is focused or defined along an axis relative the uniform magnetic field, the sensitivity axis. Consequently, as the magnetometer moves within the uniform magnetic field, the sensitivity axis changes angle relative the uniform magnetic field which registers as a gradient in the uniform magnetic field. Accordingly, in response to the gradient, a signal is outputted by the magnetometer indicating the presence of an object when no object exists. Such misrepresentation of a non-existing object is one example of a false alarm.

Security screening systems must eliminate false alarms to accurately discriminate between threatening and non-threatening objects. Accordingly, exemplary security screening systems according to embodiments of the invention rely on sensors or magnetometers configured to form a gradiometer. An exemplary gradiometer device has two identical sensors (e.g., magnetometers) provided in a fixed relationship with their respective sensitivity axes aligned. In this fixed and aligned configuration, the respective sensors of the gradiometer will output identical signals for a given uniform magnetic field which are subtracted from one another to give a zero output signal. Accordingly, if the gradiometer is moved within a uniform magnetic field, such as provided by the earth, identical signals are registered and subtracted to give a zero output signal. That is, movement of the gradiometer within the uniform magnetic field has no effect, and therefore, no output signal is registered, unlike the magnetometer device. The gradiometer is stated to be in a balanced state or condition when the output signal is zero. This balanced state effectively eliminates the presence of the uniform magnetic field, and correspondingly, resolves the problem of registering a false alarm or misleading signal when the gradiometer is moved within the uniform magnetic field.

The collective sensitivity axes of the respective sensors of a gradiometer define a sensing region of the gradiometer. If a ferrous object enters the sensing region of the gradiometer, different signals are registered (not identical signals as in the uniform magnetic field) indicating the presence of a magnetic field for the ferrous object. The signals are measured and outputted as data representative of features or characteristics of the ferrous object. In an exemplary embodiment of a security screening system, an array of gradiometers is provided wherein the collective sensing regions of each gradiometer defines a screening region of the system. When a ferrous object is present in the screening system, processing algorithms determine if the feature characteristics indicate a non-threatening object or a threatening object. If processing determines that a threatening object is present, an appropriate indication or alarm is provided by the system.

Referring to FIG. 1, an exemplary gradiometer circuitry 10 comprises magnetoresistive sensors 20 and 40 (also referred to as "MR sensors") as the active sensing components. The MR sensors 20 and 40 are provided in a gradiometer configuration. An exemplary magnetoresistive sensor is a commercially available element provided by Honeywell, Inc., with a specific example being a Honeywell HMC1001 sensor. Exemplary magnetoresistive sensors are made of a nickel-iron (Permalloy) thin film deposited on a silicon wafer and patterned as resistive strips. Exemplary resistive strips according to embodiments of the invention are configured in a wheatstone bridge design. Being exposed to a magnetic field, the respective resistive strips of the wheatstone bridge change resistance wherein the total resistance of the wheatstone bridge becomes unbalanced which provides an output voltage signal representative of the magnetic field. Using magnetoresistive sensors as the active sensing components of a magnetic field detection system have numerous advantages relative other magnetometer elements. For example, the response period of the magnetoresistive sensor is relatively quick compared to conventional systems relying on coils and oscillating frequencies which limit the response period. Additionally, in comparison to conventional systems using flux gates, magnetoresistive sensors exhibit low offset drift, higher sensitivity, low coercivity along the sensitivity axis and long term stability. Another advantage for using magnetoresistive sensors is the capability of repeatable magnetic output signals that are independent or not affected by mechanical stress on the magnetoresistive sensors.

Still referring to FIG. 1, the MR sensors 20 and 40 are configured as wheatstone bridges. The gradiometer circuitry 10 includes separate and discrete circuitry, for example feedback loop circuitry, dedicated for each MR sensor 20 and 40 for coupling each MR sensor separately to a processor 16 or microprocessor. An exemplary processor is a digital signal processor 16 (also referred to as DSP processor). Conventional gradiometers have a single circuit coupling a processor to the two sensors wherein the two sensors receive the same signals from the processor. In the gradiometer circuitry 10 of the illustrated embodiments, the separate and discrete circuitry allows for separate and distinct signals that are specifically tailored for and provided to the respective MR sensors 20 and 40. A feedback circuit 62 is dedicated specifically to MR sensor 20 and couples the MR sensor 20 to DSP processor 16 and a set/reset component or strap 60 described more thoroughly subsequently. A feedback circuit 64 is dedicated specifically to MR sensor 40 and couples the MR sensor 40 to DSP processor 16 and set/reset strap 60. A feedback circuit 72 is dedicated specifically to MR sensor 20 and couples the MR sensor 20 to DSP processor 16 and an offset adjustment device 70 described more thoroughly subsequently. A feedback circuit 74 is dedicated specifically to MR sensor 40 and couples the MR sensor 40 to DSP processor 16 and offset adjustment device 70.

Still referring to FIG. 1, because the gradiometer circuitry 10 includes its own DSP processor 16, the gradiometer circuitry 10 can handle sophisticated firmware and software. MR sensor 20 can be referred to as a near sensor and MR sensor 40 can be referred to as a far sensor. Additional electronic components within gradiometer circuitry 10 which are coupled between the DSP processor 16 and near sensor 20 includes: amplifier 22; filter 24; and analog-digital converter 26 (also referred to as ADC). Additional electronic components within gradiometer circuitry 10 which are coupled between the DSP processor 16 and far sensor 40 include: amplifier 42; filter 44; and analog-digital converter 46 (hereinafter ADC). Gradiometer circuitry 10 further includes a logic component 76, a SRAM component 78 and a flash component 80, and each are coupled to the DSP processor 16. The flash component 80 comprises manufacturer's data, ADC sample rate, ADC filter parameters, digital filter parameters and sensor board ID information. The gradiometer circuitry 10 further includes a universal serial bus (USB) 82 coupled to DSP processor 16 to enable any of a variety of peripheral devices to be plugged to and communicate with the gradiometer circuitry 10. For example, the USB 82 can provide communication between the DSP processor 16 and an emulator that comprises JTAG/setup/diagnostics data. Alternatively, or in combination, the USB 82 can provide communication between the DSP processor 16 and an internal network. The gradiometer circuitry 10 further includes an oscillator 84 and a power source 86, wherein the power is conditioned before powering components of the gradiometer circuitry 10. The gradiometer circuitry 10 further includes communication with radiation sensors, for example, infrared sensors 88 configured with break beams discussed below.

Due to manufacturing tolerances, exemplary MR sensors have different operational characteristics which detrimentally influence the performance capabilities of a gradiometer configuration. For example, each MR sensor can have different sensitivity aspects such as non-linearity characteristics and different environmental or background noise impacts. Accordingly, due to these manufacturing tolerances, the gradiometer will be in an unbalanced state and output an erroneous or misleading signal (another exemplary false alarm), called an "offset voltage," without any MR sensor stimulus from a magnetic field gradient. If this offset voltage is excessive, the performance capabilities of the gradiometer, for example, the dynamic range and linear operational region of respective MR sensors, are detrimentally affected. The offset voltage needs to be compensated for or canceled to improve the performance capabilities of the gradiometer configuration.

Accordingly, to compensate for or null offset voltages, an exemplary gradiometer circuitry 10 according to embodiments of the invention include respective offset straps incorporated into the circuitry of respective MR sensors 20 and 40. An exemplary embodiment of an offset strap is a resistor positioned across at least one leg of respective output nodes of each exemplary wheatstone bridge of respective MR sensors 20 and 40. An exemplary embodiment of the resistor is a programmable voltage controlled resistor, or programmable potentiometer. The programmable resistor or potentiometer enables the capability of an operator to actively and selectively control the offset voltage implemented by the offset straps.

For example, still referring to FIG. 1, the offset adjustment device 70 controls the offset straps of respective MR sensors 20 and 40. The offset adjustment device 70 receives instructions from DSP processor 16 to provide a defined current to the offset straps. The offset straps are used as feedback elements to drive sensor output voltages to zero, which effectively electronically nulls or compensates for the offset voltage due to the imbalance. Accordingly, the nulling will provide and maintain the MR sensors 20 and 40 in a balanced state and optimize the linear operational region. The offset voltage outputs of respective MR sensors 20 and 40 (e.g., wheatstone bridges) go through the respective instrumentation amplifiers and are digitized by respective analog-digital converters. The digitized output voltage is processed by the DSP processor 16 and is available to independently drive the offset straps via offset adjustment device 70 for respective MR sensors 20 and 40. It should be understood that the offset straps can be used to auto-calibrate the wheatstone bridges of exemplary MR sensors 20 and 40.

Figure 2:
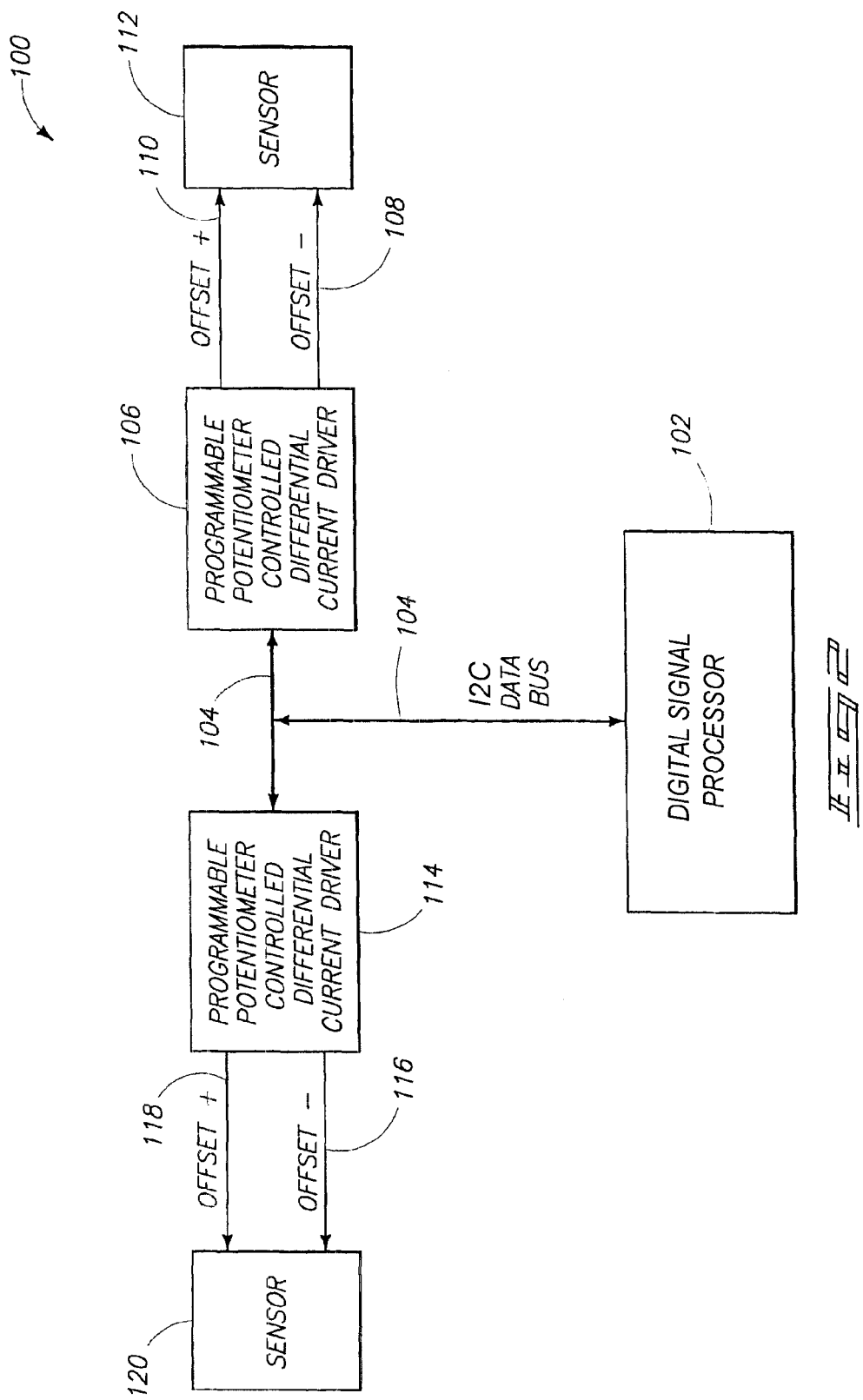
FIG. 2 is a schematic diagram of an exemplary offset adjustment component or device according to various embodiments of the present invention. An exemplary offset adjustment device can be incorporated into the circuitry of FIG. 1.

Referring to FIG. 2, an exemplary offset adjustment device 100 is shown. The offset adjustment device 100 can be used or provided in gradiometer circuitry 10 of FIG. 1. Sensor 112 is a magnetoresistive sensor and configured as, for example, a wheatstone bridge. The sensor 112 is coupled to a differential current driver 106 that is controlled by a programmable potentiometer (digital potentiometer control word). Sensor 120 is a magnetoresistive sensor and configured as, for example, a wheatstone bridge. The sensor 120 is coupled to a differential current driver 114 that is controlled by a programmable potentiometer (digital potentiometer control word). Respective differential current drivers 106 and 114 are coupled to the DSP processor 102 via data bus 104, an exemplary data bus being an inter-integrated circuit bus (an exemplary bus being the I2C developed by Philips Semiconductor). It should be understood that the wheatstone bridges of respective sensors 112 and 120 each have a negative output node 108 and 116 and a positive output node 110 and 118. DSP processor 102 controls the static value of respective negative and positive output nodes for each sensor 112 and

120 by the programmable potentiometers which control each sensor's differential current driver. The inter-integrated circuit bus is used to write to the programmable potentiometers and to read back values for confirmation of the programming.

One exemplary method of using an offset adjustment device (70 and 100) according to an embodiment of the invention implements a continuous application of a correction signal which in effect modulates the sensor's output at a known repetition rate. Another exemplary method of using an offset adjustment device (70 and 100) according to an embodiment of the invention implements a gated feedback signal, which can be modified or tailored depending on a specific application. Both exemplary methods of using offset adjustment devices (70 and 100) have the impact of canceling or nulling any ambient magnetic fields by driving a defined current through the respective MR sensors 20 and 40 (and/or sensors 112 and 120), and for example, through the respective offset straps of the respective MR sensors 20 and 40. That is, the control of the respective offset straps is achieved through the application of differential currents, one for each MR sensor 20 and 40 (and/or sensors 112 and 120). The adjustment of these differential currents is through the adjustment of a digital potentiometer, one for each MR sensor 20 and 40 (and/or sensors 112 and 120). Each MR sensor 20 and 40 (and/or sensors 112 and 120) has a DSP-based algorithm to dynamically control the nulling of respective offset voltages for respective sensors.

One exemplary embodiment of a security screening system (described more thoroughly subsequently) will have a collection of gradiometers with MR sensors 20 and 40 having offset adjustment devices. Before a measurement or screening event begins, the offset adjustment device (70 and 100) will operate with a nulling voltage/current being provided at an exemplary frequency, for example, 1000 Hz. Moreover, after the measurement or screening event is finished, the offset strap will operate with a nulling voltage/current being provided at an exemplary frequency, and again the exemplary frequency can be 1000 Hz. The influence of this nulling brings the MR sensors 20 and 40 of the gradiometer to a zero output voltage thereby balancing the MR sensors 20 and 40 just before and just after the screening event. However, during the screening event, the offset null value is pinned to the last value provided just before the screening event begins. Accordingly, the impact from dynamic background conditions/noise and interferences, such as wheelchairs, is greatly reduced. Moreover, medium and long term environmental impacts are nulled out in real-time. That is, any impact from background noise, interferences and drift (discussed below) is limited to a finite sampling period of time equal to the period of time for the screening event.

It should be understood that another factor that creates an imbalance in the MR sensors 20 and 40 and influences offset voltage is temperature coefficients and drifts of the MR sensors 20 and 40. That is, temperature coefficients of the MR sensors 20 and 40 may not be constant, and therefore, the output voltage can drift as a function of environmental temperature extremes when the MR sensors 20 and 40 are under the same stimuli. Under these conditions, it is difficult to determine if a change in output voltage from the MR sensors 20 and 40 is a function of background noise and/or drift, or is being induced by a magnetic field of a ferrous object. Accordingly, to correct or compensate for thermal impacts, one exemplary embodiment of the invention includes providing each MR sensor 20 and 40 of gradiometer circuitry 10 in thermal sensing relation with a thermal or temperature sensor 21 and 41 (FIG. 1). Thermal sensors 21 and 41 will provide the capability to track temperatures and provide active feedback compensation to offset thermal drift sensitivity of the respective wheatstone bridges of MR sensors 20 and 40. With the thermal sensors 21 and 41 incorporated onto each MR sensor 20 and 40 of gradiometer circuitry 10, readings of thermal data are provided through respective feedback loops or circuits to the respective set/reset components pursuant to instructions from DSP processor 16. Firmware algorithms generate temperature coefficients to calculate a correction current that is applied to the offset strap to cancel or null dynamic thermal effects and/or that actively compensates for the intrinsic temperature drift sensitivity of the MR sensors 20 and 40. That is, in response to thermal feedback data received by DSP processor 16 from thermal sensors 21 and 41, the control values to MR sensors 20 and 40 from the set/reset strap 60 and the offset adjustment device 70, respectively, can be modified via software/firmware control. An exemplary embodiment of thermal sensors 21 and 41 is a thermocouple.

Figure 3:
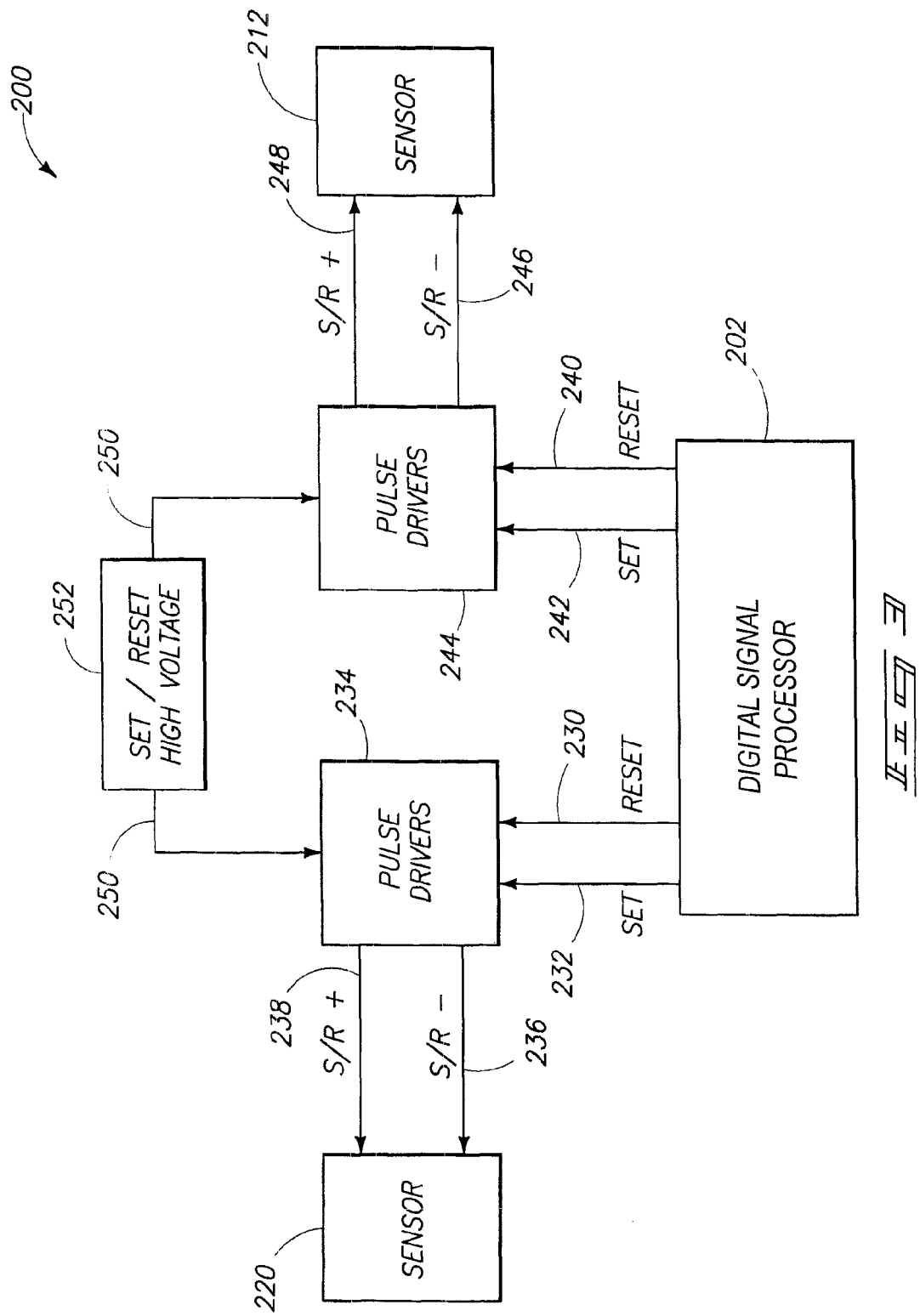
FIG. 3 is a schematic diagram of an exemplary set/reset component according to various embodiments of the present invention. An exemplary set/reset component can be incorporated into the circuitry of FIG. 1.

Another component of the present invention includes the set/reset component or strap 60 of FIG. 1 and illustrated as set/reset component or strap 252 and associated circuitry in FIG. 3. First, it should be understood that nickel-iron resistive strips of the MR sensors 20 and 40 are comprised of magnetic domains. The magnetic domains need to be aligned along an axis with the resistive strips to optimize performance and sensitivity of the MR sensors 20 and 40. That is, if these magnetic domains are not aligned and continually realigned after a measurement or sensing event, performance of the MR sensors 20 and 40 is detrimentally effected. For example, when the MR sensors 20 and 40 are exposed to magnetic fields, depending on the strength and angle of the magnetic field, at least a portion of the magnetic domains are rotated and misaligned into a random orientation. If these misaligned magnetic domains are not realigned before the next sensing event, the sensitivity and repeatability of the MR sensors 20 and 40 are diminished. Repeatability is the goal of having MR sensors 20 and 40 repeatedly register the same output signal when exposed to same stimulus conditions.

In an exemplary operation, the set/reset components are magnetically coupled with each MR sensor 20 and 40 and configured to receive pulses of current which align the magnetic domains. That is, the method of alignment comprises applying current to the set/reset components 60 to generate a magnetic field from the set/reset components, wherein the magnetic field magnetizes the magnetic domains in the resistive strips thereby aligning and/or orienting the magnetic domains. Therefore, after a sensing event or an exposure to a magnetic field, this alignment orients the magnetic domains to be in the position that existed before the sensing event or exposure to the magnetic field. Accordingly, properties and/or characteristics of the MR sensors 20 and 40 that existed before the sensing event or exposure to the magnetic field will exist again after the alignment. That is, the MR sensors 20 and 40 will provide the same output signals when under the same conditions or stimuli, and repeatedly provide the same output signals. This method of alignment restores the MR sensors to their previous level of sensitivity and removes the effects of past magnetic history to ensure the repeatability.

In an exemplary method to align and realign the magnetic domains according to an embodiment of the invention, the gradiometer circuitry 10 of FIG. 1 includes the set/reset component or strap 60. Referring now to FIG. 3, an exemplary set/reset component or strap 252 and circuitry 200 according to an embodiment of the invention is more thoroughly described, which set/reset component 252 can be incorporated into gradiometer circuitry 10 of FIG. 1. MR sensor 212 can be characterized as the far sensor and sensor 220 can be characterized as the near sensor. Each MR sensor 212 and 220 has a pulse driver 244 and 234, respectively. Set/reset component 252 is coupled 250 to the respective pulse drivers 234 and 244. The exemplary set/reset component 252 can be characterized to handle high voltage. Each pulse driver 244 and 234 is coupled to a DSP processor 202. The DSP processor 202 provides a set pulse 242 and a reset pulse 240 to pulse driver 244. The DSP processor 202 provides a set pulse 232 and a reset pulse 230 to pulse driver 234. Pulse driver 244 provides a negative set/reset pulse strobe 246 and a positive set/reset pulse strobe 248 to MR sensor 212. Pulse driver 234 provides a negative set/reset pulse strobe 236 and a positive set/reset pulse strobe 238 to sensor 220.

In operation according to an embodiment of the invention, the DSP processor controls the widths of set/reset pulse strobes 236, 238, 246, 248 by the width of the set and reset pulses 230, 232, 240, 242 to the pulse drivers 234, 244. Moreover, the DSP processor 202 controls the timing between the set and reset pulses 230, 232, 240, 242. Additionally, the DSP processor 202 controls the set and reset pulse time alignment between MR sensors 220, 212 to be concurrent or sequential. For example, according to one exemplary embodiment of the invention, the frequency of timing of an exemplary pulse of current is provided every few milliseconds. A positive pulse initiates a set and a negative pulse initiates a reset. The distinction between set and reset is simply realignment of the domains in opposite directions, wherein set is one orientation of alignment and reset is the opposite orientation of alignment. In one exemplary embodiment of the invention, latch circuitry is used to control bouncing and/or undershooting of the pulse of current so that a premature "unset" of the MR sensors 212, 220 is prevented.

The inventors of this application have determined that manipulating parameters of the pulses of current can improve the performance and sensitivity capabilities of the MR sensors 212, 220. That is, frequency, pulse width, and magnitude of the pulses of current provided to the sensors are "critical" parameters to optimize functionality of the MR sensors 212, 220. For example, in the context of thermal drift of the MR sensors 212, 220, feedback control of these "critical" parameters will allow the operation of the set/reset pulse to be optimized to offset thermal drift sensitivity. As stated previously, temperature or thermal sensors 21, 41 (FIG. 1) are incorporated into the gradiometer circuitry 10 wherein thermal readings are integrated into the feedback loop to actively compensate for the intrinsic temperature drift sensitivity of the MR sensors 20 and 40. According to an exemplary embodiment of the invention, the gradiometer circuitry 10 has the capability to selectively control and actively change the magnitude of the pulse of current provided to the MR sensors 20 and 40. Accordingly, nulling thermal drift is accomplished by manipulating the magnitude of the pulse of current to apply a voltage that is proportional to temperature coefficients to the offset adjustment component 70, thereby actively nulling out thermal drift. The pulse drivers 234, 244 (FIG. 3) provide the capability to control the magnitude of the pulses of current.

Moreover, by selectively manipulating the frequency, pulse width and/or magnitude of the pulses of current, the overall power consumption of the gradiometer is directly influenced. Accordingly, the DSP processor (e.g., 102, 202, 302) controls the tailoring of these parameters for the pulse of current to application specific requirements, such as outdoor environments with extreme weather exposure. This tailoring of current parameters allows the capability to increase power efficiency without degrading sensor performance. Accordingly, power management of the gradiometer is improved and internal thermal loads can be reduced in any given application-specific requirement.

Figure 4:
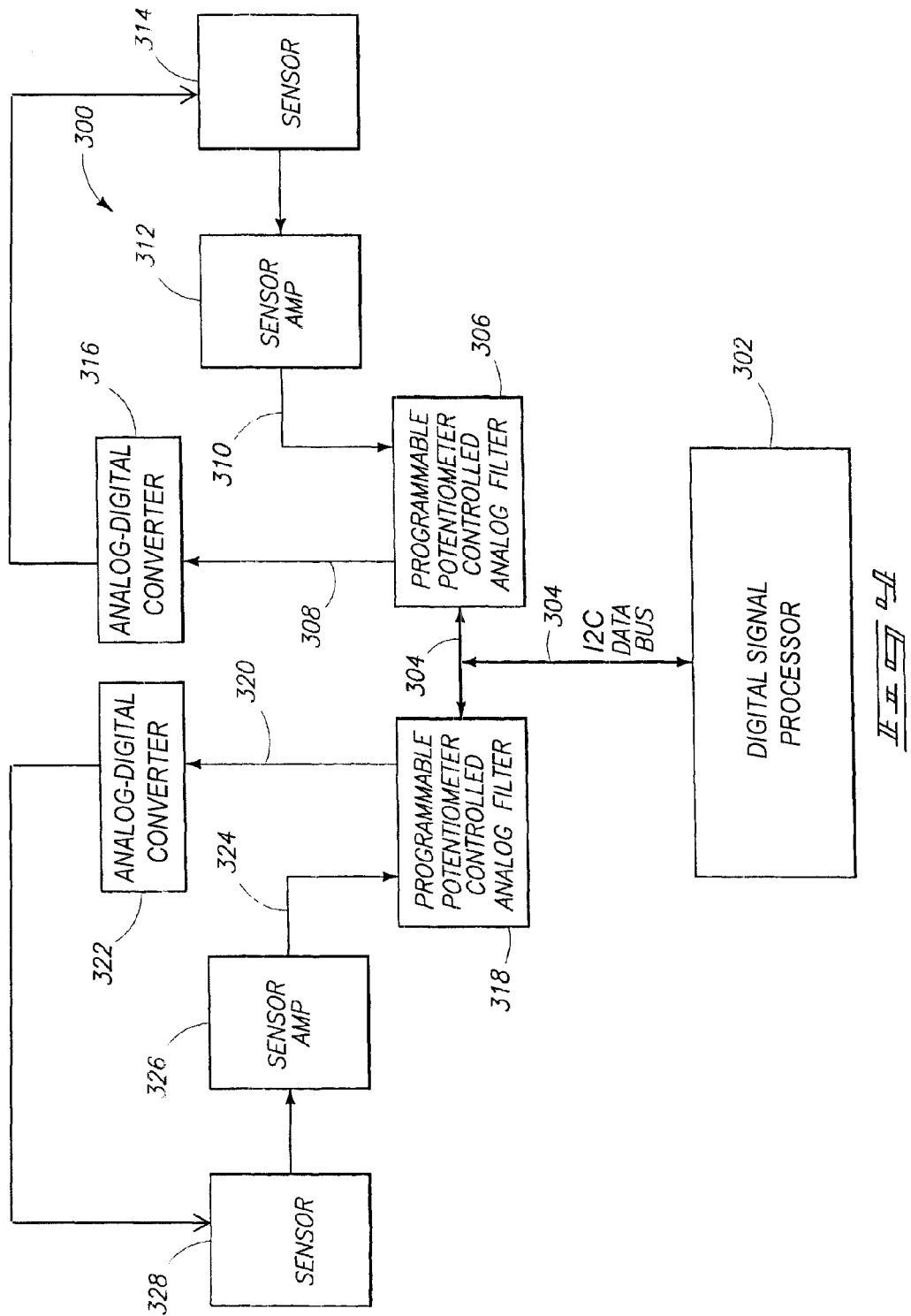
FIG. 4 is a schematic diagram of exemplary circuitry with an exemplary filter controlled by an exemplary programmable potentiometer according to various embodiments of the invention. An exemplary circuitry with an exemplary filter can be incorporated into the circuitry of FIG. 1.

Referring to FIG. 4, exemplary circuitry 300 is illustrated with an exemplary filter controlled by an exemplary programmable potentiometer according to an embodiment of the invention. DSP processor 302 is coupled via a I2C data bus 304 to respective filters 306 and 318 controlled by respective programmable potentiometers. It should be understood that circuitry 300 can be incorporated into gradiometer circuitry 10 wherein each filter 306 and 318 of FIG. 4 represents one filter-potentiometer combination (24-30 and/or 44-50) of FIG. 1, respectively. Exemplary filters 306 and 318 include analog filters. Sensor 314 is coupled to amplifier 312, which is coupled via coupler 310 to filter 306. Filter 306 is coupled via coupler 308 to analog-digital converter 316, which is coupled to sensor 314. Sensor 328 is coupled to amplifier 326, which is coupled via coupler 324 to filter 318. Filter 318 is coupled via coupler 320 to analog-digital converter 322, which is coupled to sensor 328. The DSP processor 302 controls the value of the resistance used in an R-C filter for each analog filter 306 and 318 with the programmable potentiometer or digital potentiometer control word.

In other exemplary embodiments of the invention, respective gradiometers in an exemplary security screening system are provided with multi-axial fields of view. As stated previously, a conventional gradiometer has a single sensitivity axis that defines the scanning region produced by the gradiometer for sensing magnetic fields. A single axis gradiometer is referred to as a first-order gradiometer. Having a scanning region defined by a single sensitivity axis limits the spatial aspects of the scanning region that can appropriately be sensed by the first-order gradiometer. Accordingly, in a conventional security screening system, a plurality of first-order gradiometers is arrayed to form a screening region within a portal, and the screening region is configured as a collection of the scanning regions of respective gradiometers.

The conventional array of gradiometers is arranged with respective sensitivity axes generally parallel and generally in a vertical plane. The vertical plane is generally perpendicular to the movement of a person through the portal, and therefore, only the vertical plane is available for sensing or capturing magnetic data. Accordingly, aspects of the conventional screening region within the conventional portal are limited by poor spatial resolution and dead zones. Low or poor spatial resolution diminishes sensing accuracy of a conventional system to detect ferrous objects. For example, low spatial resolution within a conventional portal results in an object or person not being adequately sensed to provide adequate information to distinguish between threatening and non-threatening objects. Objects such as cell phones, beepers and other devices that transmit signals are not appropriately distinguished from non-threatening objects, including objects with small magnetic fields. Furthermore, objects in dead zones are not detected whether threatening or non-threatening. Accordingly, potential threatening objects may pass through the portal without the conventional system signaling or indicating a potential problem. A plurality of first-order gradiometers arrayed in a conventional security screening system does not provide adequate sensing or detection information to distinguish threatening objects from non-threatening objects.

Accordingly, in exemplary embodiments of the invention, higher-order gradiometers, which have multi-axial fields of view, are provided in the portals of exemplary security screening systems. An exemplary higher-order gradiometer has more than two sensing elements. For example, a second-order gradiometer uses three sensing elements to form a scanning region for measuring magnetic field parameters. By precise placement of the center sensor of the gradiometer, the capability exists to tailor the direction of the sensitivity axis, and correspondingly the scanning regions or patterns, of the gradiometer. Moreover, the second-order gradiometer effectively has two sensitivity axes instead of one which increases the size of the scanning region, that is, increases the field-of-view capabilities of the gradiometer. Second-order gradiometers approximate the second derivative of the magnetic field and have larger magnetic noise immunity. In essence, the second-order gradiometer acts as a compensated magnetometer and is modeled as two gradiometers connected in series opposition.

A third-order gradiometer effectively has three sensitivity axes instead of two which increases the size of the scanning region relative a second-order gradiometer, that is, increases the field-of-view capabilities of the gradiometer. Consequently, according to an embodiment of the invention, a security screening system will have an array of second-order gradiometers establishing a screening region within a portal. According to another embodiment of the invention, a security screening system will have an array of third-order gradiometers establishing a screening region within a portal. According to still another embodiment of the invention, a security screening system will have an array of a combination of second- and third-order gradiometers establishing a screening region within a portal. Using second- and third-order gradiometers will improve the sensitivity and distinguishing capabilities of screening regions within security screening systems by diminishing dead zones and the zones of low or poor spatial resolution.

Additionally, it should be understood that the sensitivity pattern or scanning region of a gradiometer is a function of the physical overall length of the gradiometer in relationship with the position of each individual MR sensor within the gradiometer. Undesirable magnetic fields generated by distant sources, such as automobile traffic and monorails, can be large enough to mask or overwhelm the desired magnetic fields representative of people or objects in portals to be processed. To compensate for the undesirable magnetic field noise, an electronic noise cancellation method is employed in combination with a multi-order gradiometer, for example a second-order gradiometer, according to an embodiment of the invention. For this configuration, one of the three MR sensors in the second-order gradiometer is used as a reference magnetometer for a compensation channel. The reference sensor should be located far enough away from the security screening system so as not to detect desirable magnetic fields, but proximate enough to sense the same magnetic noise measured by the other sensors of the gradiometer. An exemplary placement of the reference sensor is in the header or front portion of the portal. Noise cancellation is performed by simultaneously taking data from the reference sensor, which reads undesirable magnetic fields and the other sensors that read desirable magnetic fields. In post processing, the outputs of the respective readings are assigned weighing functions and processed in a cancellation algorithm to minimize any background and common mode noise. Other embodiments of the present invention can take time derivatives of the magnetic field components into the cancellation algorithm to further minimize background noise contributions and impacts.

Figure 5:
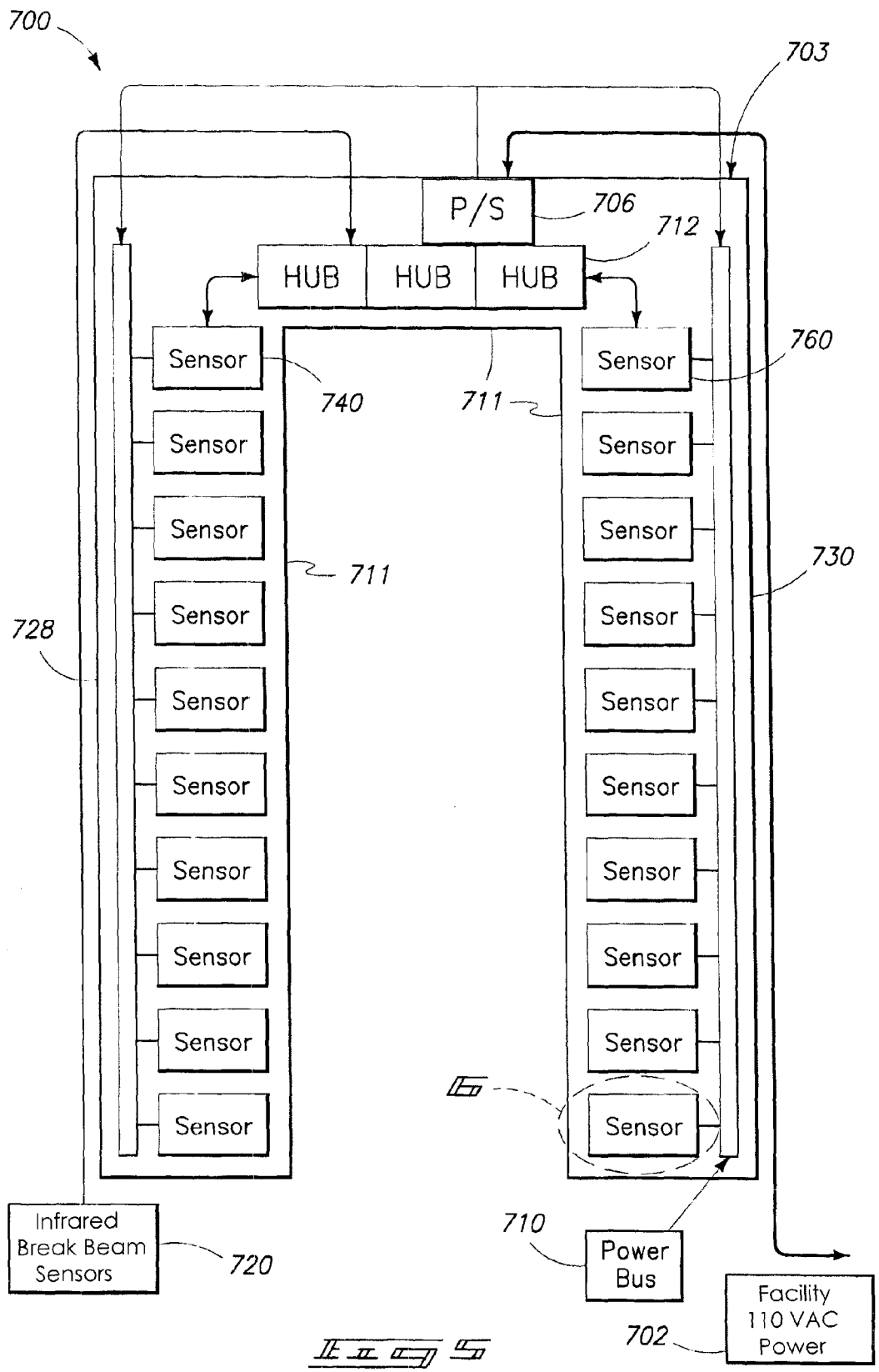
FIG. 5 is a front elevational view of an exemplary security screening system according to various embodiments of the present invention.
Figure 6:
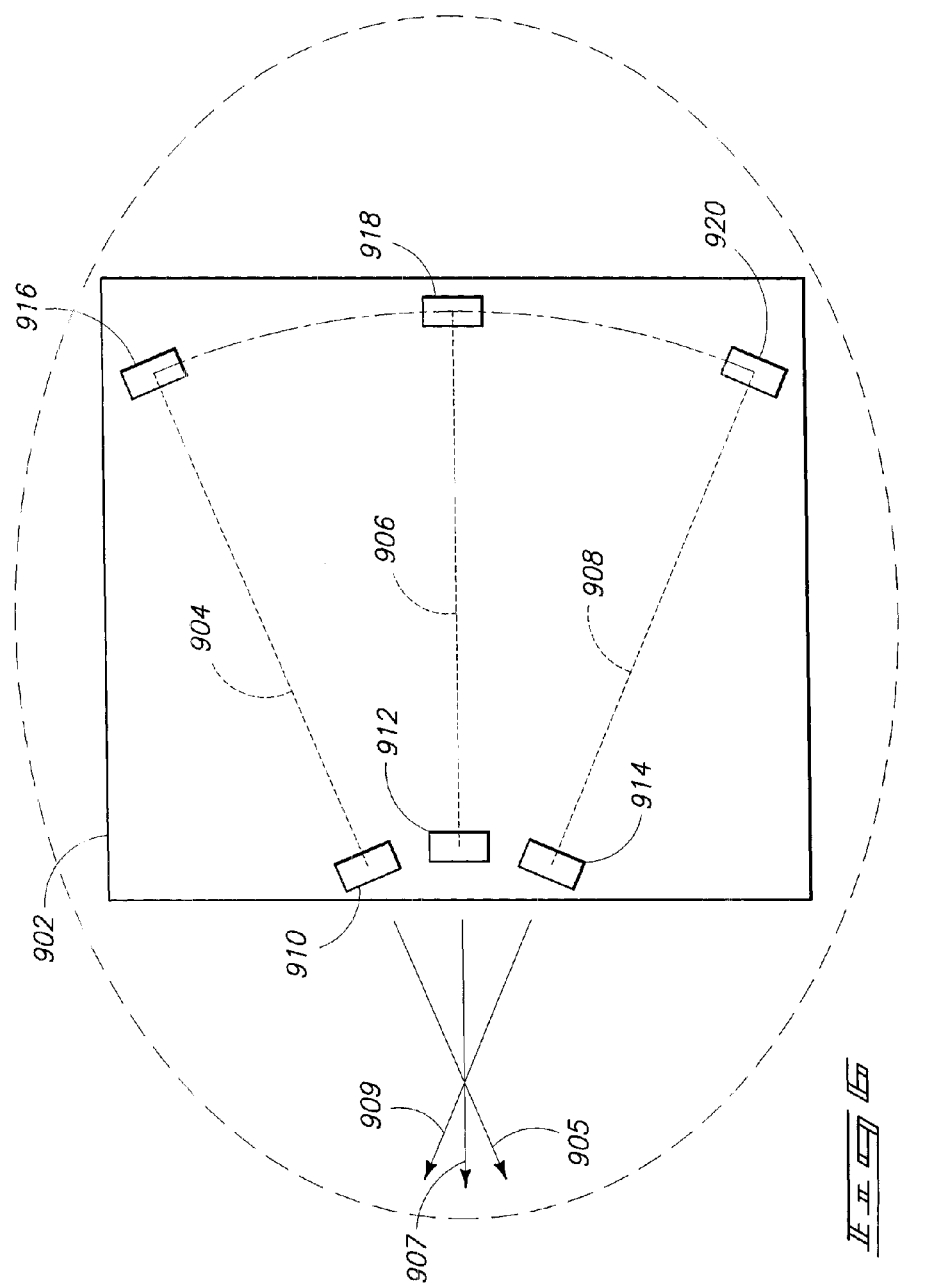
FIG. 6 is an enlarged view of an exemplary magnetic sensor board of the FIG. 5 security screening system according to various embodiments of the present invention.

Referring to FIGS. 5 and 6, an exemplary security screening system 700 according to an embodiment of the invention will now be described. Referring to FIG. 5, security screening system 700 incorporates an array of magnetic sensors or gradiometers (or magnetic sensor boards) arranged in a portal structure or frame 703 to form a screening region therein. It should be understood that the exemplary gradiometers or magnetic sensor boards 740, 760 in security screening system 700 can be configured with circuitry and components as described above, for example, the multi-order gradiometers discussed previously and the gradiometers shown with respect to FIGS. 1-4. An exemplary portal structure 703 defines a passageway or gateway 711 (doorway) having an entrance and an exit configured for allowing items and persons to pass through for inspection. Opposite vertical portions 728 and 730 of the exemplary portal frame 703 house respective arrays of gradiometers or magnetic sensor boards 740 and 760 (only one magnetic sensor board in each vertical portion 728 and 730 is referenced with a number). Each exemplary magnetic sensor board 740 and 760 extends in an exemplary vertical orientation and comprises the gradiometer configuration with MR sensors. Exemplary electrical power of 110 VAC is provided from an exemplary facility 702, such as an airport, to magnetic sensor boards 740 and 760 via a power supply 706, hub 712 and power bus 710 combination. It should be understood that according to exemplary embodiments of the invention, the array of magnetic sensor boards 740 and 760 can be arranged in any of a wide variety of configurations to define a screening region. For example, magnetic sensor boards 740 and 760 can be provided in an upper portion of portal frame 703 to extend generally horizontally, and/or in floor portions which support the portal frame 703 and to extend again in generally a horizontal orientation.

Still referring to FIG. 5, in some embodiments, the security screening system 700 includes one or more trigger devices 720 that signal when a person or object is approaching the entrance and leaving the exit of the portal structure 703. An exemplary trigger device 720 includes at least one infrared break beam sensor or photo-detector that projects at least one radiation beam across and in front of the entrance relative the direction of the moving person. Additionally, another exemplary trigger device 720 includes at least one infrared break beam sensor or photo-detector that projects at least one radiation beam across and after the exit relative the direction of the moving person. Interrupting the radiation beam proximate the entrance triggers the DSP processor to initiate a screening or measurement event and the data acquisition mode (discussed below) for the security screening system 700. Interrupting the radiation beam proximate the exit triggers the DSP processor to signal the array of gradiometers to terminate the screening event and the data acquisition mode. It should be understood that the radiation beams can be positioned at any selected distance from the entrance and exit of the security screening system 700.

Referring to FIG. 6, a more detailed illustration of an exemplary magnetic sensor or magnetic sensor board for security screening system 700 (FIG. 5) is shown according to an embodiment of the invention. In exemplary embodiments, magnetic sensor board 902 (represented as 740 and 760 of FIG. 5) comprises at least one gradiometer having a sensitivity axis provided at an angle relative to a vertical axis. In exemplary embodiments, magnetic sensor board 902 comprises at least two gradiometers, each having a sensitivity axis wherein one axis is provided at an angle relative to the other axis. Moreover, in exemplary embodiments, magnetic sensor board 902 comprises at least two gradiometers having respective sensitivity axes wherein one axis is provided at an angle relative to the other axis in a common plane. In an exemplary orientation, the common plane can be oriented in a horizontal plane, that is, the horizontal plane will extend in the direction of a moving person through portal structure 703 (FIG. 5).

Still referring to FIG. 6, magnetic sensor board 902 includes a plurality of gradiometers, for example three gradiometers 904, 906 and 908. Gradiometers 904, 906, 908, respectively, include MR sensor pairs 910/916, 912/918, 914/920, having respective sensitivity axes 905, 907 and 909 oriented at angles to each other in the horizontal plane. In this exemplary orientation, the page would be oriented horizontally. It should be understood that the page could be oriented at any angle relative the horizontal plane to further define differently oriented planes for the respective sensitivity axes 905, 907 and 909. Accordingly, the angled sensitivity axes 905, 907 and 909 of respective gradiometers 904, 906 and 908 collectively define a horizontal aspect of an enlarged screening region for security screening system 700 (FIG. 5). The enlarged screening region, according to an embodiment of the invention, is defined as having a vertical aspect combined with the horizontal aspect to define a screening region that represents a volume as opposed to simply a vertical plane of conventional systems. It should be understood that the vertical aspect of the inventive screening region is provided by the orientation of each magnetic sensor board being provided vertically in the vertical portions 728 and 730 of portal structure 703 (FIG. 5). Moreover, in this exemplary embodiment, the screening region will be defined to extend in front of the portal structure 703 before the entrance and to extend in the opposite direction after the exit.

Accordingly, a person moving through the doorway 711 of the portal structure 703 will be in the screening region for a greater period of time because of the horizontal aspect of the screening region. This increased period of sensing time allows the security screening system 700 to increase the amount of magnetic data gathered as being representative of objects moving through the screening region. Since more magnetic data is gathered, more crucial characteristics of the object and/or person are obtained to more accurately distinguish between non-threatening and threatening objects. Additionally, dead zones and zones of low or poor spatial resolution are reduced and preferably eliminated, which improves the sensitivity and distinguishing capabilities of security screening system 700.

Figure 7:
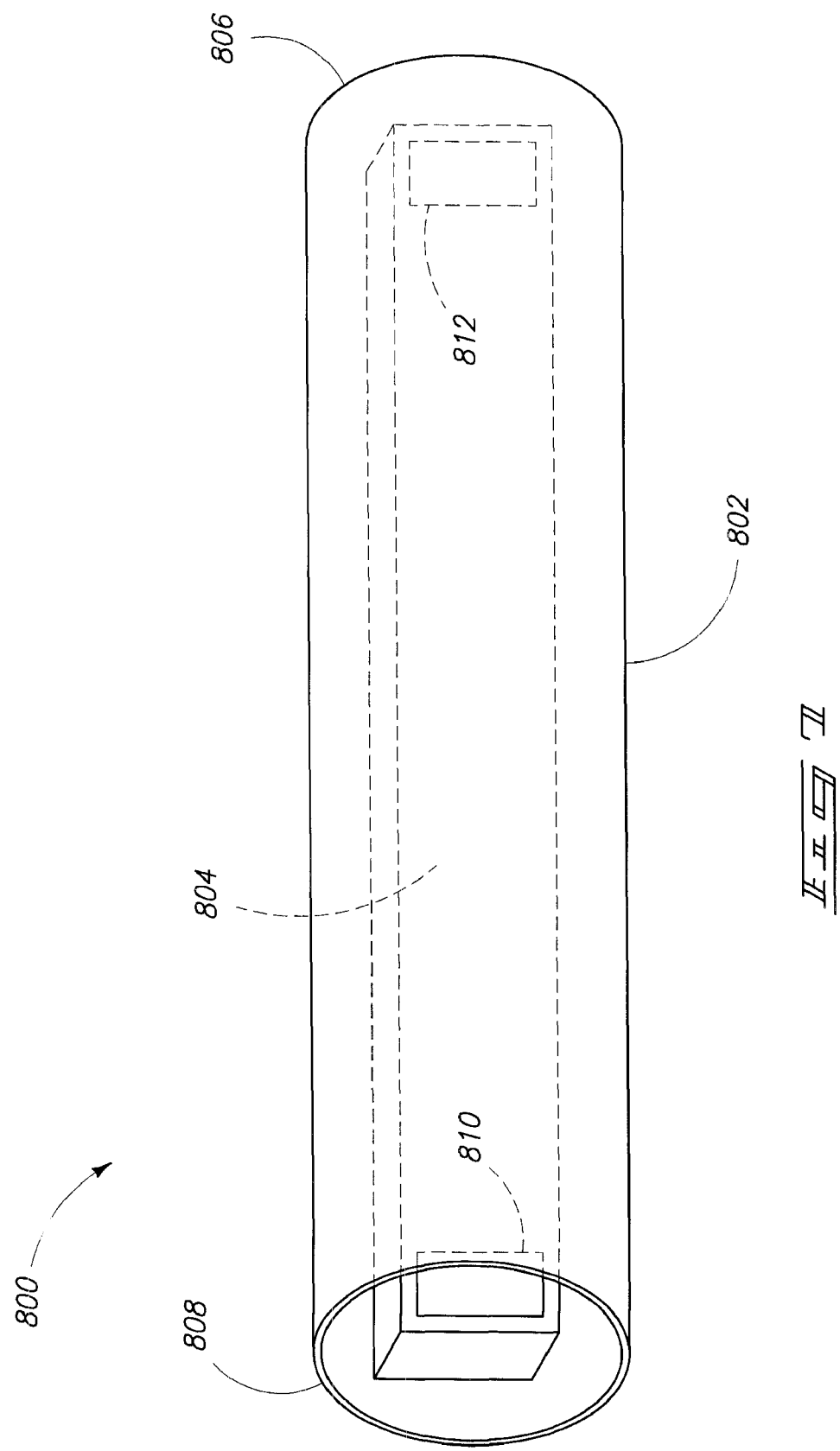
FIG. 7 is a perspective view of an exemplary mu-metal aperture device according to various embodiments of the present invention.

Referring to FIG. 7, a mu-metal aperture device 800 is illustrated according to another embodiment of the invention. An exemplary mu-metal aperture device 800 can be integrated into the magnetic sensor board 902 (FIG. 6) of the portal structure 703 of security screening system 700 (FIG. 5). That is, a mu-metal aperture device 800 can replace or represent one or more of the plurality of gradiometers 904, 906 and 908 (FIG. 6) for any one magnetic sensor board 740 and 760 (FIG. 5) of the vertical portions 728 and 730 of portal structure 703. For example, referring to FIG. 7, mu-metal aperture device 800 includes a gradiometer configured as a gradiometer sensor board 804 having a near sensor 810 opposite a far sensor 812. The gradiometer sensor board 804 is substantially enclosed by a mu-metal tube 802 having an open end 808 proximate near sensor 810 and a closed or sealed end 806 proximate far sensor 812.

In operation, and by phasing electromagnetic flow of current through the mu-metal aperture device 800, the mu-metal aperture device 800 provides the capability to alter the induction path or direction orientation of flux lines of a magnetic field. That is, altering the direction orientation of flux lines effectively provides the capability of steering the directionality of the sensitivity axis and scanning region of the gradiometer. The capability of steering the directionality of the sensitivity axis of a gradiometer provides the capability of steering the directionality of a screening region for an exemplary security screening system 700 according to an embodiment of the invention. Selectively steering the screening region of security screening system 700 provides the capability of following a person progressing through the doorway 711 of portal structure 703. With the steering capability, an object and/or person can be maintained within the screening region for a greater period of time, increasing the sensing period of the object and/or person. Accordingly, with the mu-metal aperture device 800, more magnetic data is gathered wherein more crucial characteristics of the object and/or person are obtained to more accurately distinguish between non-threatening and threatening objects.

Other embodiments of the present invention provide security screening systems that reduce interference from adjacent or proximate magnetic noise sources, such as wheelchairs, passing outside but proximate a portal structure. A conventional gradiometer has a symmetrical field of view or scanning region that extends in opposite directions, that is, in a forward direction (a front lobe) and a backward direction (a back lobe) relative the gradiometer. Consequently, the array of gradiometers in an exemplary portal structure of an exemplary security screening system provides a screening region with collective front lobes extending into the portal passageway and collective back lobes extending outside the portal structure. As a metal object passes outside the portal structure at a given distance, the metal object is detected or scanned within the collective back lobes of the screening region at the same sensitivity as if the metal object passed through the portal passageway at the same given distance from the portal structure.

Consequently, the back lobes of a screening region for a conventional security screening system create several problems. For example, the conventional system has to be strategically located in a facility in controlled traffic areas to avoid items such as wheelchairs from passing too close to the portals. An additional consideration is that the number of portals for a given conventional system is limited to allow adequate space between respective portals to avoid interference between the portals. Limiting the number of portals in a given system limits the throughput capabilities of the system. Therefore, the problem caused by the collective back lobes of a conventional screening region needs to be addressed.

The trigger device discussed previously for an exemplary security screening system will solve the back lobe problem for a screening region. The capability of the exemplary security screening system to determine when a person is within the portal passageway allows the processing logic of the DSP processor of respective gradiometers to distinguish between responses from legitimate magnetic fields and responses from illegitimate magnetic fields, such as background noise. That is, if magnetic fields are detected when the security screening system has determined to have a person in the portal passageway, the detected magnetic fields will be characterized as legitimate magnetic fields to be further processed. Alternatively, if magnetic fields are detected when the security screening system has determined not to have a person in the portal passageway, the detected magnetic fields will be characterized as illegitimate magnetic fields not to be further processed. The illegitimate magnetic fields represent drift or magnetic background noise that need to be suppressed. Accordingly, if the trigger devices have not notified the respective gradiometers of a person being within the portal passageway and a wheelchair passes through the back lobes of the screening region, the magnetic responses of this event are characterized as illegitimate to be filtered out, suppressed or canceled. This capability will provide "event specific" (that is, the sensing or data gathering event) filtering to block undesirable/illegitimate magnetic fields.

Another exemplary embodiment of a method according to the invention is to filter out specific magnetic data that is known to representative a non-threatening object. That is, the non-threatening object will provide magnetic data that is already known to represent that non-threatening object, a magnetic signature or fingerprint. For example, the magnetic field of a wheelchair within a screening region is known to generate specific magnetic field responses that include a low frequency signal and a large amplitude. Moreover, a wheelchair is large enough to enter the field of view of multiple sensors or gradiometers in a portal passageway. These characteristics are the magnetic signature or fingerprint for a wheelchair. If these characteristics are detected for an object in a screening region, the DSP processing determines the object is a wheelchair that needs to be dismissed or filtered. The processing of an exemplary security screening system during a measurement event is performed in a specific frequency domain. Therefore, the DSP processor is programmed to filter out known magnetic fingerprints representative of non-threatening objects such as wheelchairs from the data acquisition processing stream (discussed below with respect to FIG. 8). Exemplary filtering methods include wavelets analysis and bank filters. Moreover, the DSP processor is selectively programmed to address or filter any other known magnetic fingerprints that represent non-threatening objects. Accordingly, whether the wheelchair passes through the back lobe of the screening region or through the portal passageway in the front lobe, the signature data is filtered. By implementing the exemplary circuitry 300 of FIG. 4 of the filter being controlled by the programmable potentiometer, the capability exists to dynamically adjust the high-pass filter cutoff parameters as a function of the magnitude of the pinned offset compensation value. This capability will provide "event specific" filtering to block known magnetic fields for non-threatening objects.

Furthermore, in other exemplary methods of the invention, digital communication is provided between adjacent portals so that regional environmental impacts, such as approaching wheelchairs, can be monitored and filtered from the adjacent portals. That is, if one portal senses a magnetic field having magnetic signatures representative of a wheelchair, the adjacent portals can receive a warning status message and temporally suspend operation until the wheelchair has passed. This reduces the possibility of adjacent portals being overwhelmed with magnetic background noise or interference from other portals (or outside the portal) which can cause the operation of the adjacent portal to malfunction. Additionally, more portals can be implemented in a given security screening system and the spacing between portals can be reduced, thereby reducing the footprint of a given system. These security screening system designs will increase the throughput of the system.

Figure 8:
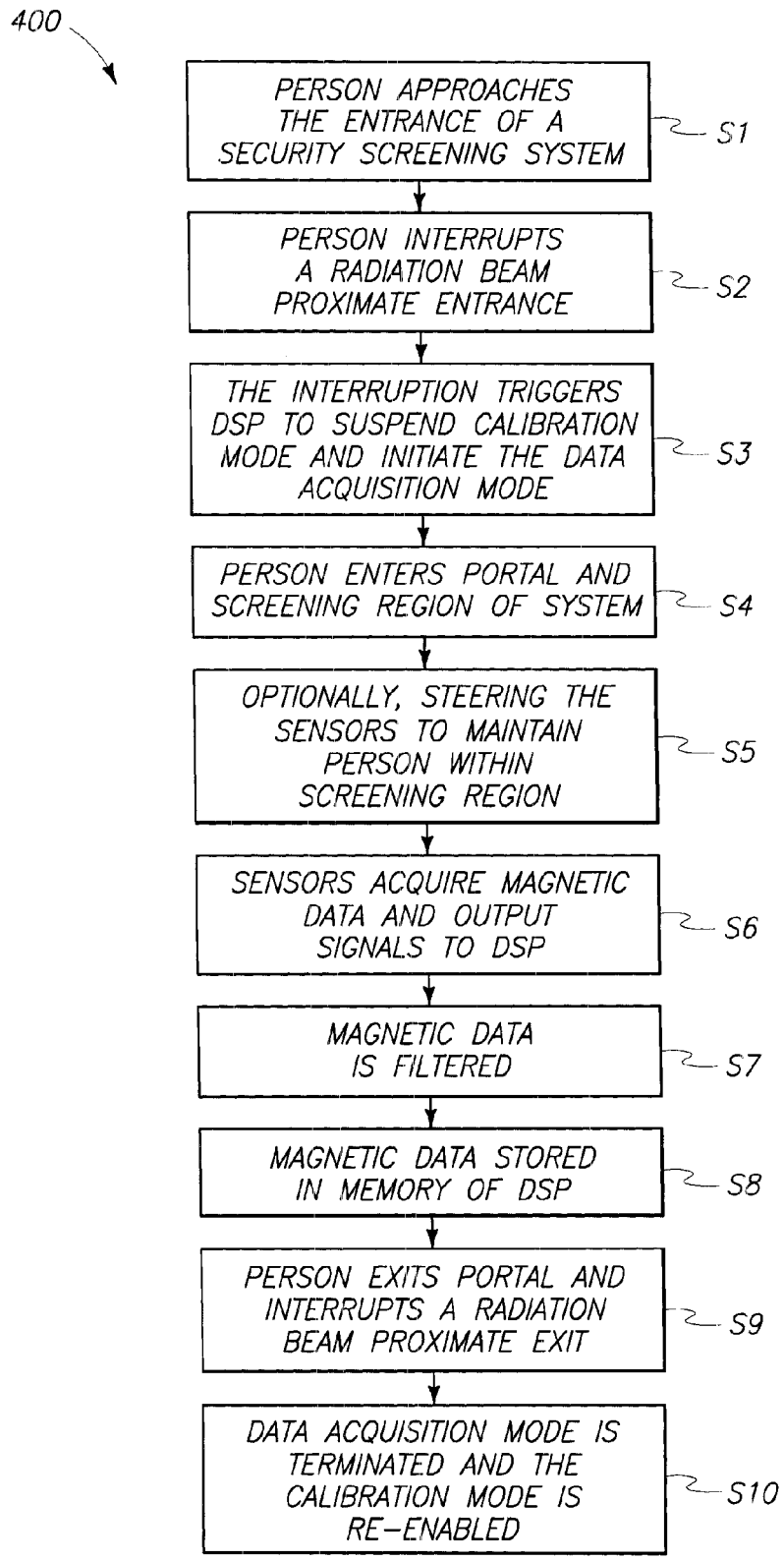
FIG. 8 is a method diagram for using an exemplary security screening system in an exemplary data acquisition mode according to various embodiments of the present invention.

Referring to FIG. 8, a method 400 of using an exemplary security screening system in an exemplary data acquisition mode according to an embodiment of the invention is illustrated by the following exemplary steps. An exemplary security screening system includes security screening system 700 of FIG. 5. Before a data acquisition mode is initiated, preferably the system is in a calibration mode discussed subsequently with respect to FIG. 9. Step s1 illustrated in FIG. 8, a person and/or object (hereinafter person) approaches the entrance of the portal of the security screening system. Step s2, the person passes through the radiation beam and thereby interrupts the beam proximate the entrance. Step s3, the radiation beam interruption triggers each DSP processor of each sensor of each gradiometer to terminate the calibration mode and to initiate the data acquisition mode wherein sensors of respective gradiometers are prepared to receive magnetic data of the screening event. Step s4, the person enters the portal and the screening region of at least some gradiometers (the collective scanning regions of the gradiometers define the screening region of the system).

Still referring to FIG. 8, step s5, optionally, if the system has steering capabilities, at least one gradiometer is activated to pivot or steer to follow the person's movement through the portal. The steering capability allows the opportunity to keep or maintain the person within the screening region of the at least one gradiometer for a selected period of time. Step s6, as the person continues through the portal and the screening region of the system, sensors of respective gradiometers repeatedly acquire magnetic data representative of the person, and any object on the person, during the screening event. Step s7, the magnetic data is amplified and filtered. The filtering reduces unwanted high-frequency effects, drift and background noise such as power line noise (60 Hz). The DSP processors receive feedback signals to allow the system to dynamically control and modify the filter parameters. Moreover, each sensor has an operation curve with a "sweet spot" that allows achievement of maximum signal-to-noise performance. That is, the performance of the sensors are characterized to have a first known spectrum of magnetic data that represent signals that warrant further processing. Additionally, the performance of the sensors are characterized to have a second known spectrum of magnetic data that represents background noise to be filtered out. Filter algorithms are provided to separate the first and second spectrums of magnetic data. Step s8, magnetic data is stored in a memory of the DSP processor. Step s9, the person exits the portal and interrupts the radiation beam proximate the exit. Step s10, the interruption suspends the data acquisition mode of the system and re-enables the calibration mode.

Further processing and analyzing of the magnetic data is more thoroughly discussed, with respect to steps s7 and s8 of the data acquisition mode, and/or with respect to the calibration mode discussed below. Conventional magnetic sensors are analog devices that output voltage signals as a function of the magnetic field intensity being sensed by the system. Accordingly, the spectral content of the measured magnetic data is not fully extracted and/or available for advanced signal processing methods. According to embodiments of the present invention, the full dynamic range and spatial resolution of passive gradiometer sensors are exploited to extract out unique response features or characteristics for use by computer-based classification algorithms.

In an exemplary embodiment of the present invention, raw magnetic data is obtained from the gradiometer as magnetic gradient versus time. Magnetic data is acquired at a user specified sample rate. That is, magnetic data is over-sampled by an analog-to-digital converter at an exemplary frequency range, for example, an exemplary frequency range being from about 8 to about 25 KHz. The magnetic date is filtered and stored in memory by the DSP processor. Magnetic data is sampled from the time the radiation beam proximate the entrance is interrupted to the time the radiation beam proximate the exit is interrupted.

Figure 9:
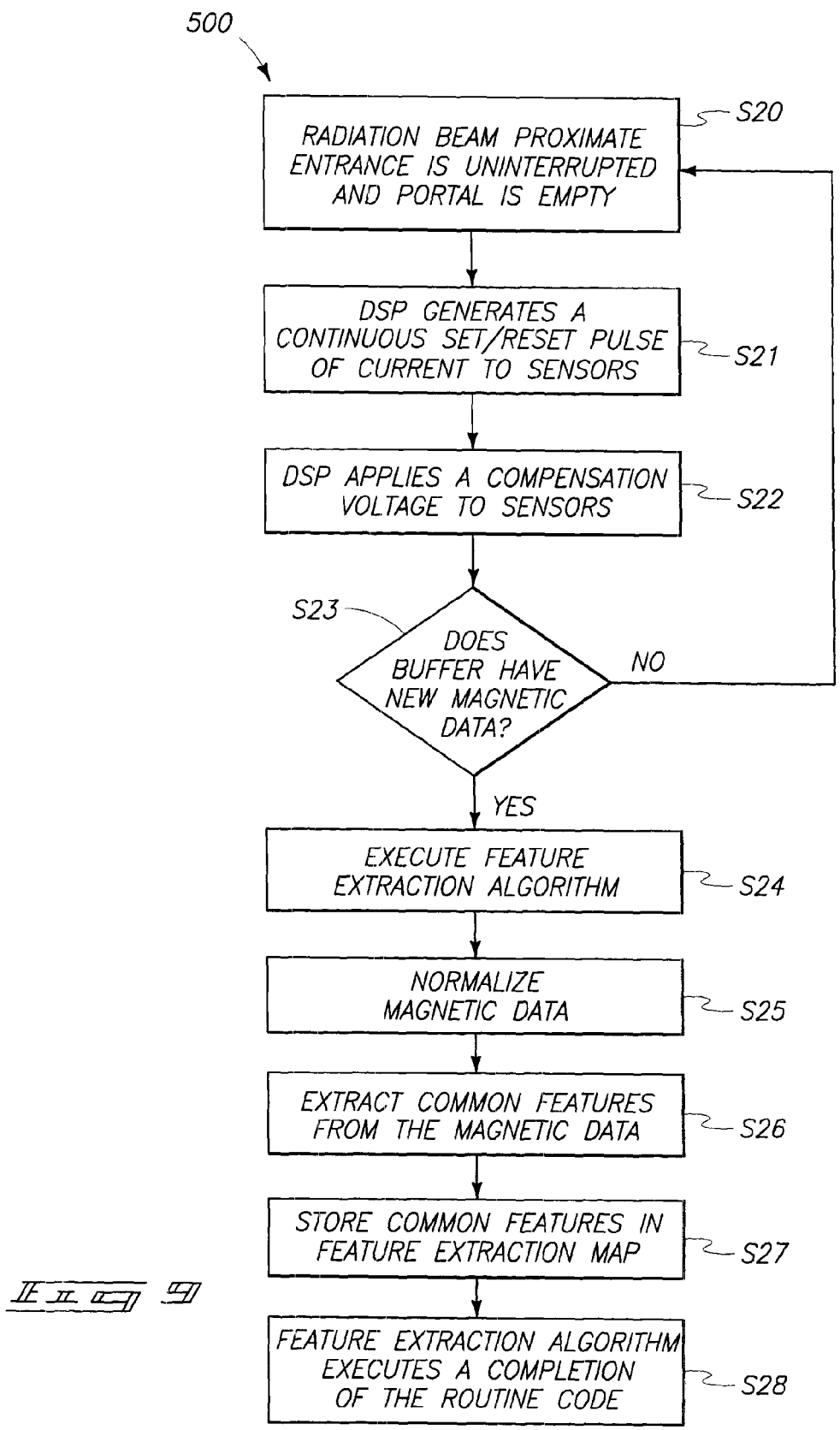
FIG. 9 is a method diagram for using an exemplary security screening system in an exemplary calibration mode according to various embodiments of the present invention.

Referring to FIG. 9, a method 500 of using the exemplary security screening system in an exemplary calibration mode according to an embodiment of the invention is illustrated by the following exemplary steps. The exemplary security screening system includes security screening system 700 of FIG. 5. Before a person or object interrupts the radiation beam proximate the entrance, the system is in the calibration mode. After a screening event, that is, after a person or object interrupts the radiation beam proximate the exit of the system, the calibration mode is re-enabled. Accordingly, if the portal is empty, no screening event is occurring and the system is in calibration mode. Calibration mode includes the following exemplary steps. Step s20, the radiation beam proximate the entrance is uninterrupted (maintained), and therefore, the DSP processor is not triggered to initiate the data acquisition mode and/or a screening event. Since the portal is empty, the sensor calibration mode of the security screening system continues or is implemented. Step s21, the DSP processor strobes the sensors to continually provide pulses of current to the sensors thereby continually setting and resetting the sensors of respective gradiometers of the system. Step s22, the DSP processor strobes the sensors to continually apply compensating voltages to null or cancel the offset voltages of the sensors of respective gradiometers of the system. Step s23, the DSP processor queries the buffer for new magnetic data. If there is no new magnetic data, the process returns to step s20. If new magnetic data is present, the process continues on to step s24. It should be understood that step s23 and subsequently described steps could be performed simultaneously during the data acquisition mode.

Still referring to FIG. 9, step s24, a feature extraction algorithm is called by the DSP processor for execution and the new magnetic data is placed in a buffer. Step s25, the buffered magnetic data is normalized to a predefined size to facilitate the extraction of common features. Step s26, common features from the buffered magnetic data are extracted. For example, generally stated, time domain information is extracted from the buffered magnetic data. Additionally, frequency domain information is extracted from the buffered magnetic data. Further processing includes time sequence analysis. Step s27, the common features are set up in output data arrays according to an exemplary feature extraction map and then stored in memory. Step s28, the feature extraction algorithm executes a return code to the DSP processor that indicates the completion of the routine. The output data arrays are sent to a host computer, for example a portable computer, for further processing where the output data arrays are processed by exemplary pattern classification algorithms which will provide notification of items or objects on a person that warrant investigation.

Figure 10:
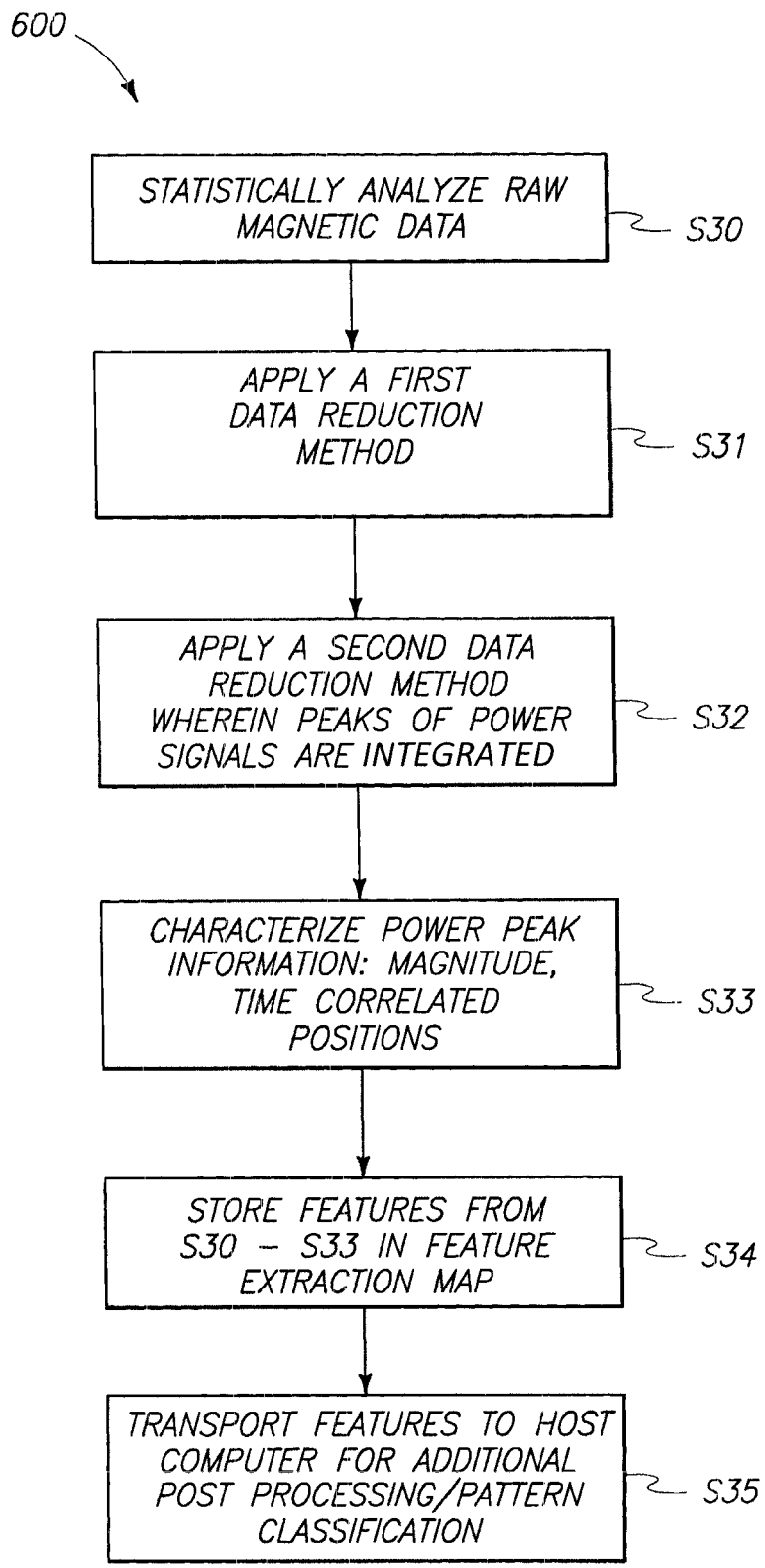
FIG. 10 is a method diagram of an exemplary feature extraction method for a security screening system according to various embodiments of the present invention.

Referring to FIG. 10, an exemplary method 600 of extracting common features from magnetic data, as disclosed in step s26 above, is more thoroughly described according to an embodiment of the invention. As stated previously, raw or initial magnetic data is obtained from the respective gradiometers in the form of magnetic field gradients versus time. Step s30, the raw magnetic data is statistically analyzed by, for example, performing standard deviation/mean calculations. Step s31, performing a first data reduction method to the raw magnetic data, wherein an exemplary data reduction method is disclosed by U.S. Pat. No. 6,150,810 to Roybal, the disclosure of which is incorporated herein by reference. This first data reduction method is based on determining an absolute value difference between a maximum datum and a minimum datum of the statistically analyzed data and determining whether the absolute value difference has a positive or negative sign. Step s32, performing a second data reduction method to the raw magnetic data wherein peaks of power signals are integrated. Step s33, the power peak information is characterized into, for example, magnitude and time correlated positions. Step s34, the data obtained from steps s30-s33 represent magnetic features and characteristics which are stored in the feature extraction map. Step s35, the magnetic features are communicated to a host computer for the additional processing by pattern classification algorithms.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. Circuitry for detecting magnetic fields, the circuitry comprising:
   a first magnetoresistive sensor;
   a second magnetoresistive sensor, wherein the first magnetoresistive sensor and the second magnetoresistive sensor are configured to operate in combination to form a gradiometer;
   a digital signal processor;
   a first feedback loop operably coupling the first magnetoresistive sensor and the digital signal processor;
   a second feedback loop discrete from the first feedback loop, the second feedback loop operably coupling the second magnetoresistive sensor and the digital signal processor; and
   wherein at least one of the first feedback loop and the second feedback loop comprises at least one of a set/reset component and an offset adjustment device coupled between the digital signal processor and at least one of the first magnetoresistive sensor and the second magnetoresistive sensor.

2. The circuitry of claim 1, wherein the first feedback loop comprises an offset adjustment device comprising:
   a first differential current driver coupled between the first magnetoresistive sensor and the digital signal processor;
   a first programmable potentiometer configured to control the first differential current driver;
   a second differential current driver coupled between the second magnetoresistive sensor and the digital signal processor; and
   a second programmable potentiometer configured to control the second differential current driver.

3. The circuitry of claim 1, further comprising:
   a first filter coupled between the first magnetoresistive sensor and the digital signal processor;
   a first programmable potentiometer configured to control the first filter;
   a second filter coupled between the second magnetoresistive sensor and the digital signal processor; and
   a second programmable potentiometer configured to control the second filter.

4. The circuitry of claim 1, further comprising a mu-metal aperture electrically coupled with the digital signal processor.

5. The circuitry of claim 1, further comprising at least one thermal sensor in sensing relation with at least one of the first and the second magnetoresistive sensors.

6. Circuitry for detecting magnetic fields, the circuitry comprising:
   a first magnetoresistive sensor;
   a second magnetoresistive sensor, wherein the first magnetoresistive sensor and the second magnetoresistive sensor are configured to operate in combination to form a gradiometer;
   a digital signal processor;
   a first feedback loop coupled between the first magnetoresistive sensor and the digital signal processor;

a second feedback loop discrete from the first feedback loop, the second feedback loop coupled between the second magnetoresistive sensor and the digital signal processor; and a third magnetoresistive sensor electrically coupled to the digital signal processor, wherein each magnetoresistive sensor comprises a sensitivity axis, and wherein two of the three sensitivity axes are substantially aligned and the third sensitivity axis is angled relative to the two aligned sensitivity axes.

7. Circuitry for detecting magnetic fields, the circuitry comprising:

a first magnetoresistive sensor;

a second magnetoresistive sensor, wherein the first magnetoresistive sensor and the second magnetoresistive sensor are configured to operate in combination to form a gradiometer;

a digital signal processor;

a first feedback loop coupled between the first magnetoresistive sensor and the digital signal processor, the first feedback loop comprising at least one of a set/reset component and an offset adjustment device operably coupled between the first magnetoresistive sensor and the digital signal processor;

a second feedback loop discrete from the first feedback loop, the second feedback loop coupled between the second magnetoresistive sensor and the digital signal processor; and wherein the first and the second magnetoresistive sensors comprise respective sensitivity axes, the sensitivity axis of the first magnetoresistive sensor being angled relative the sensitivity axis of the second magnetoresistive sensor.

8. Circuitry for detecting magnetic fields, the circuitry comprising:

a first magnetoresistive sensor;

a second magnetoresistive sensor, wherein the first magnetoresistive sensor and the second magnetoresistive sensor are configured to operate in combination to form a gradiometer;

a digital signal processor;

a first feedback loop coupled between the first magnetoresistive sensor and the digital signal processor;

a second feedback loop discrete from the first feedback loop, the second feedback loop coupled between the second magnetoresistive sensor and the digital signal processor;

a first pulse driver coupled between the first magnetoresistive sensor and the digital signal processor;

a first programmable potentiometer configured to control the first pulse driver;

a second pulse driver coupled between the second magnetoresistive sensor and the digital signal processor; and a second programmable potentiometer configured to control the second pulse driver.

9. A security screening system comprising:

a portal configured to receive a person;

an array of gradiometers comprising respective sensitivity axes that collectively define a screening region within the portal, the respective sensitivity axes being oriented substantially parallel to one another; and at least one other gradiometer comprising a sensitivity axis being angled relative to the respective sensitivity axes of the array of the gradiometers such that the sensitivity axis of the at least one other gradiometer intersects at least one axis of the respective sensitivity axes.

10. The system of claim 9, wherein each gradiometer of the array comprises at least two magnetic sensors, and wherein at least one gradiometer of the array comprises more than two magnetic sensors.

11. The system of claim 9, further comprising a trigger device configured to indicate when a person is approaching the portal and exiting the portal.

12. The system of claim 9, wherein the array of the gradiometers comprises magnetoresistive sensors.

13. The system of claim 9, wherein the array of the gradiometers comprises magnetoresistive sensors, and wherein the magnetoresistive sensors comprise wheatstone bridges.

14. A method for detecting magnetic fields, the method comprising:

providing a security screening system comprising a portal, the portal comprising an array of gradiometers which establish a screening region within the portal, each gradiometer being electrically coupled to a microprocessor;

notifying the microprocessor that a person is approaching the portal;

in response to the notifying, implementing a data acquisition mode of the system for receiving magnetic field data of the person while in the screening region; and altering a direction orientation of flux lines of a magnetic field for steering the array of gradiometers to maintain the person within the screening region.

15. The method of claim 14, further comprising providing a radiation beam to extend proximate an entrance of the portal and oriented to be traversed by the person approaching the portal, and wherein the notifying occurs in response to the person interrupting the radiation beam.

16. The method of claim 14, further comprising:

providing a radiation beam to extend proximate an exit of the portal and oriented to be traversed by the person when exiting the portal;

interrupting the beam by the person moving through the exit of the portal; and in response to the interrupting, notifying the microprocessor to suspend the data acquisition mode and implement a calibration mode of the system.

17. The method of claim 14, further comprising:

before implementing the data acquisition mode, continually monitoring output signals from each gradiometer;

in response to the monitoring, continually providing compensating signals from the microprocessor to null each output signal; and for each gradiometer, storing a last compensating signal provided before implementing the data acquisition mode.

18. The method of claim 17, further comprising:

implementing the data acquisition mode;

retrieving the last compensating signal for each gradiometer; and during the data acquisition mode, repeatedly providing the last compensating signal for each gradiometer.

19. A method for detecting magnetic fields, the method comprising:

configuring a first magnetoresistive sensor and a second magnetoresistive sensor to form a gradiometer with a set/reset component in a feedback circuit thereof;

repeatedly providing electrical pulses through the feedback circuit to the first and the second magnetoresistive sensors to align and realign magnetic domains of the first and second magnetoresistive sensors to generate a magnetic field from the set/reset component in order, the electrical pulses comprising at least the following electrical characteristics: frequency, pulse width and magnitude; and selectively altering at least one of the electrical characteristics of at least one of the electrical pulses.

20. The method of claim 19, wherein the selectively altering comprises changing the pulse width of the at least one of the electrical pulses.

21. The method of claim 19, wherein the selectively altering comprises changing the magnitude of the at least one of the electrical pulses.

22. The method of claim 19, wherein the selectively altering comprises changing the frequency of the at least one of the electrical pulses.

* * * * *

UNITED STATES PATENT AND TRADEMARK OFFICE
CERTIFICATE OF CORRECTION

| | | |
|---|---|---|
| PATENT NO. | : 7,796,028 B1 | Page 1 of 1 |
| APPLICATION NO. | : 11/461515 | |
| DATED | : September 14, 2010 | |
| INVENTOR(S) | : Dale K. Kotter et al. | |

It is certified that error appears in the above-identified patent and that said Letters Patent is hereby corrected as shown below:

In the claims:

CLAIM 19, COLUMN 20, LINES 65-67, change "align and realign magnetic domains of the first and second magnetoresistive sensors to generate a magnetic field from the set/reset component in order," to --generate a magnetic field from the set/reset component in order to align and realign magnetic domains of the first and second magnetoresistive sensors,--

Signed and Sealed this
Twentieth Day of August, 2013

Teresa Stanek Rea
*Acting Director of the United States Patent and Trademark Office*